(«12») United States Patent
Arakawa et al.

(10) Patent No.: US 11,050,365 B2
(45) Date of Patent: Jun. 29, 2021

(54) PIEZOELECTRIC DRIVING DEVICE, ELECTRONIC COMPONENT CONVEYANCE APPARATUS, ROBOT, PROJECTOR, AND PRINTER

(71) Applicant: Seiko Epson Corporation, Tokyo (JP)

(72) Inventors: Yutaka Arakawa, Hara-mura (JP); Tomohisa Iwazaki, Shimosuwa (JP)

(73) Assignee: Seiko Epson Corporation

( * ) Notice: Subject to any disclaimer, the term of this patent is extended or adjusted under 35 U.S.C. 154(b) by 665 days.

(21) Appl. No.: 15/967,875

(22) Filed: May 1, 2018

(65) Prior Publication Data

US 2018/0323729 A1 Nov. 8, 2018

(30) Foreign Application Priority Data

May 8, 2017 (JP) .............................. JP2017-092203

(51) Int. Cl.
*H02N 2/10* (2006.01)
*H02N 2/00* (2006.01)
(Continued)

(52) U.S. Cl.
CPC ............ *H02N 2/103* (2013.01); *B25J 9/0009* (2013.01); *B25J 9/12* (2013.01); *B41J 2/14201* (2013.01); *B65G 23/22* (2013.01); *H02N 2/0015* (2013.01); *H02N 2/0055* (2013.01); *H02N 2/0095* (2013.01); *H02N 2/026* (2013.01);
(Continued)

(58) Field of Classification Search
CPC ........ H02N 2/14; H02N 2/103; H02N 2/0095; H02N 2/026; H02N 2/0015; H02N 2/0055; H01L 21/67706; B25J 9/12; B25J 9/0009; B65G 23/22; B41J 2/14201; G03B 2205/0015; G03B 2205/0061; G03B 21/142

See application file for complete search history.

(56) References Cited

U.S. PATENT DOCUMENTS

2008/0042525 A1* 2/2008 Shin ..................... H02K 21/145
310/49.32
2014/0218815 A1* 8/2014 Hino ........................ H02N 2/12
359/824

(Continued)

FOREIGN PATENT DOCUMENTS

| JP | 2013-148395 A | 8/2013 |
| JP | 2015-136278 A | 7/2015 |
| JP | 2016-016479 A | 2/2016 |

*Primary Examiner* — Emily P Pham
(74) *Attorney, Agent, or Firm* — Harness, Dickey & Pierce, P.L.C.

(57) ABSTRACT

A first member, a second member, a bearing that rotatably supports the second member about a rotation axis relative to the first member, a driven member placed on the first member, and a plurality of piezoelectric actuators that transmit driving forces for rotating the second member about the rotation axis relative to the first member to the driven member are provided, and the piezoelectric actuators are supported by the second member while being pressed against the first member or the member fixed thereto, and, as seen from a direction along the rotation axis, a center of pressing forces from the plurality of piezoelectric actuators to the driven member is located inside of an outer circumferential part of the bearing.

20 Claims, 9 Drawing Sheets

(51) Int. Cl.
 *B65G 23/22* (2006.01)
 *B41J 2/14* (2006.01)
 *B25J 9/00* (2006.01)
 *H02N 2/02* (2006.01)
 *B25J 9/12* (2006.01)
 *G03B 21/14* (2006.01)
 *H01L 21/677* (2006.01)

(52) U.S. Cl.
 CPC .... *G03B 21/142* (2013.01); *G03B 2205/0015* (2013.01); *G03B 2205/0061* (2013.01); *H01L 21/67706* (2013.01)

(56) References Cited

U.S. PATENT DOCUMENTS

2015/0068349 A1* 3/2015 Hirabayashi ............. B25J 17/00
 74/490.03
2015/0171773 A1 6/2015 Suefuji et al.
2017/0371173 A1* 12/2017 Bietry ................ G02B 26/0891
2018/0287514 A1* 10/2018 Iwazaki ............... H02N 2/0055
2018/0294747 A1* 10/2018 Arakawa ................ H02N 2/028

* cited by examiner

PIEZOELECTRIC DRIVING DEVICE, ELECTRONIC COMPONENT CONVEYANCE APPARATUS, ROBOT, PROJECTOR, AND PRINTER

BACKGROUND

1. Technical Field

The present invention relates to a piezoelectric driving device, electronic component conveyance apparatus, robot, projector, and printer.

2. Related Art

In related art, as a piezoelectric driving device using a piezoelectric actuator that drives a driven member by vibrating a vibrator using a piezoelectric element, e.g. a device such as a position changing mechanism unit described in Patent Document 1 (JP-A-2013-148395) is known.

The device described in Patent Document 1 has a tubular supporting part, a rotor provided inside of the supporting part coaxially with the supporting part, two ring-shaped bearings provided between the supporting part and the rotor, and a piezoelectric actuator that rotates the rotator relative to the supporting part. Here, the piezoelectric actuator is in contact with a position not on a rotation axis of the rotor.

However, it is difficult to obtain a large driving force from the device described in Patent Document 1 because the driving force is obtained from the single piezoelectric actuator. Further, the single piezoelectric actuator is in contact with the position not on the rotation axis of the rotor from one side, and the device described in Patent Document 1 has a problem that moment is generated between the inner rings and the outer rings of the bearings and, as a result, the relative attitude of the supporting part and the rotor varies.

SUMMARY

An advantage of some aspects of the invention is to provide a piezoelectric driving device that can obtain a larger driving force and relatively rotate two members in stable attitudes, and provide an electronic component conveyance apparatus, a robot, a projector, and a printer including the piezoelectric driving device.

The invention can be implemented as the following forms or application examples.

A piezoelectric driving device according to an application example includes a first member, a second member, a bearing that rotatably supports the second member about a rotation axis relative to the first member, a driven member placed on the first member, and a plurality of piezoelectric actuators that transmit driving forces for rotating the second member about the rotation axis relative to the first member to the driven member, wherein the piezoelectric actuators are supported by the second member while being pressed against the first member or a member fixed thereto, and, as seen from a direction along the rotation axis, a center of pressing forces from the plurality of piezoelectric actuators to the driven member is located inside of an outer circumferential part of the bearing.

According to the piezoelectric driving device, the plurality of piezoelectric actuators are used and the larger driving forces can be obtained. In addition, as seen from the direction along the rotation axis, the center of the pressing forces from the plurality of piezoelectric actuators to the driven member is located on the side of the rotation axis (inside) of the outer circumferential part of the bearing, and thereby, the moment generated between the first member side and the second member side by the pressing forces can be reduced and, as a result, the relative attitude of the first member and the second member can be stabilized.

In the piezoelectric driving device according to the application example, it is preferable that a direction of the pressing force includes a direction component parallel to the rotation axis.

With this configuration, the forces in the direction parallel to the rotation axis can be stably applied to the first member side and the second member side of the bearing. Accordingly, rattles of the bearing can be reduced and, as a result, the relative attitude of the first member and the second member can be stabilized more effectively.

In the piezoelectric driving device according to the application example, it is preferable that, as seen from the direction along the rotation axis, the center of the pressing forces coincides with the rotation axis.

With this configuration, the moment generated between the first member side and the second member side by the pressing forces can be reduced more effectively.

In the piezoelectric driving device according to the application example, it is preferable that, as seen from the direction along the rotation axis, the plurality of piezoelectric actuators are located inside of the outer circumferential part of the bearing.

With this configuration, the moment generated between the first member side and the second member side by the pressing forces can be reduced more effectively.

In the piezoelectric driving device according to the application example, it is preferable that the bearing has an inner ring fixed to the first member, an outer ring placed outside of the inner ring and fixed to the second member, and a plurality of rolling members placed between the inner ring and the outer ring, and, as seen from the direction along the rotation axis, the center of the pressing forces is located inside of the outer ring.

With this configuration, loads in both the direction along the rotation axis and the radial direction orthogonal thereto can be applied to the bearing with reduced rattles of the bearing.

An electronic component conveyance apparatus according to an application example includes the piezoelectric driving device according to the application example.

According to the electronic component conveyance apparatus, high-accuracy operation of the electronic component conveyance apparatus can be realized using such action and effect of the piezoelectric driving device that the relative attitude of the first member and the second member can be stabilized.

A robot according to an application example includes the piezoelectric driving device according to the application example.

According to the robot, high-accuracy operation of the robot can be realized using such action and effect of the piezoelectric driving device that the relative attitude of the first member and the second member can be stabilized.

A projector according to an application example includes the piezoelectric driving device according to the application example.

According to the projector, high-accuracy operation of the projector can be realized using such action and effect of the piezoelectric driving device that the relative attitude of the first member and the second member can be stabilized.

A printer according to an application example includes the piezoelectric driving device according to the application example.

According to the printer, high-accuracy operation of the printer can be realized using such action and effect of the piezoelectric driving device that the relative attitude of the first member and the second member can be stabilized.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a piezoelectric driving device, an electronic component conveyance apparatus, a robot, a projector, and a printer according to the invention will be explained in detail based on embodiments shown in the accompanying drawings.

1. Piezoelectric Driving Device

Figure 1:
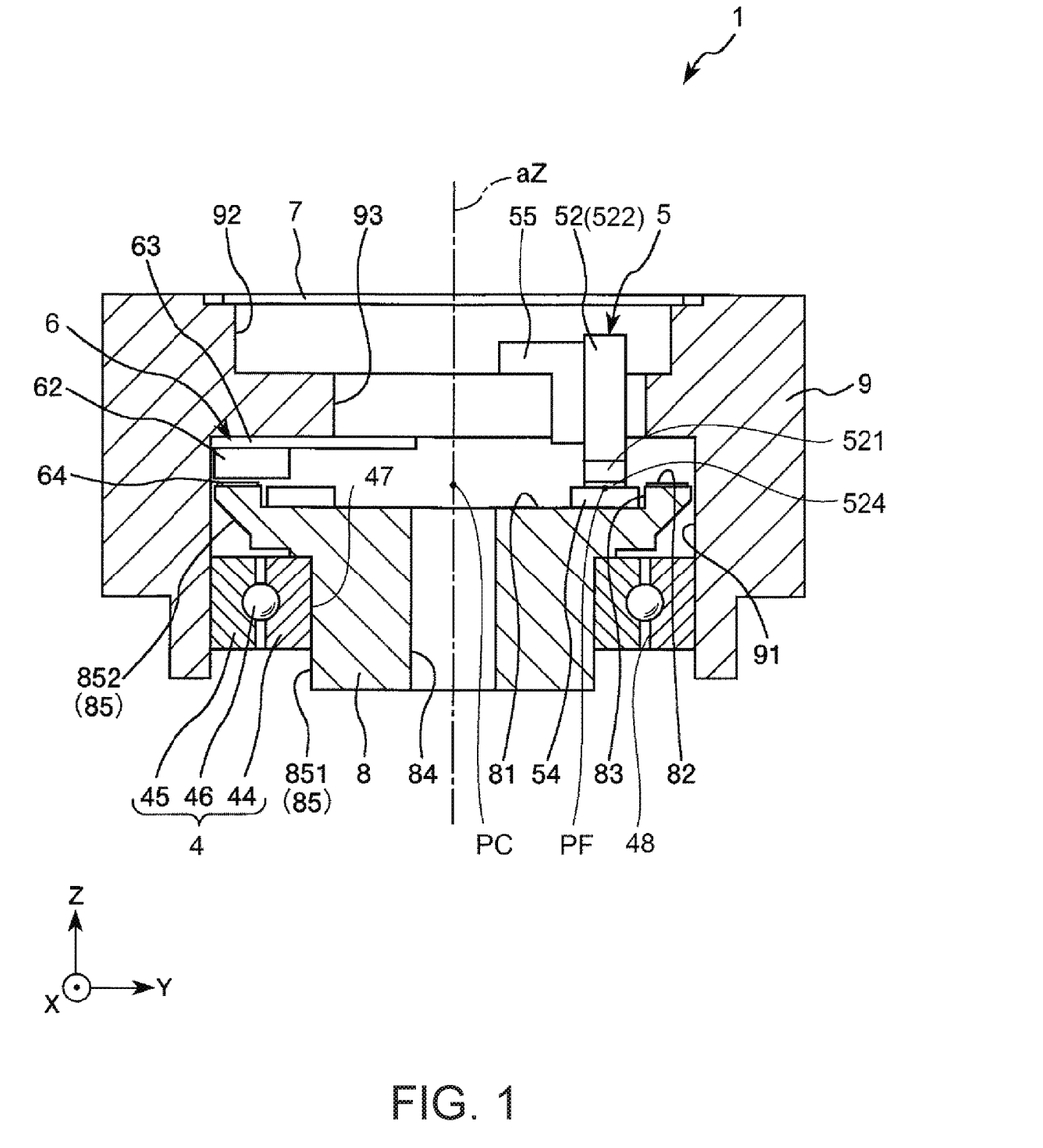
FIG. 1 is a sectional view showing a piezoelectric driving device according to an embodiment of the invention.
Figure 2:
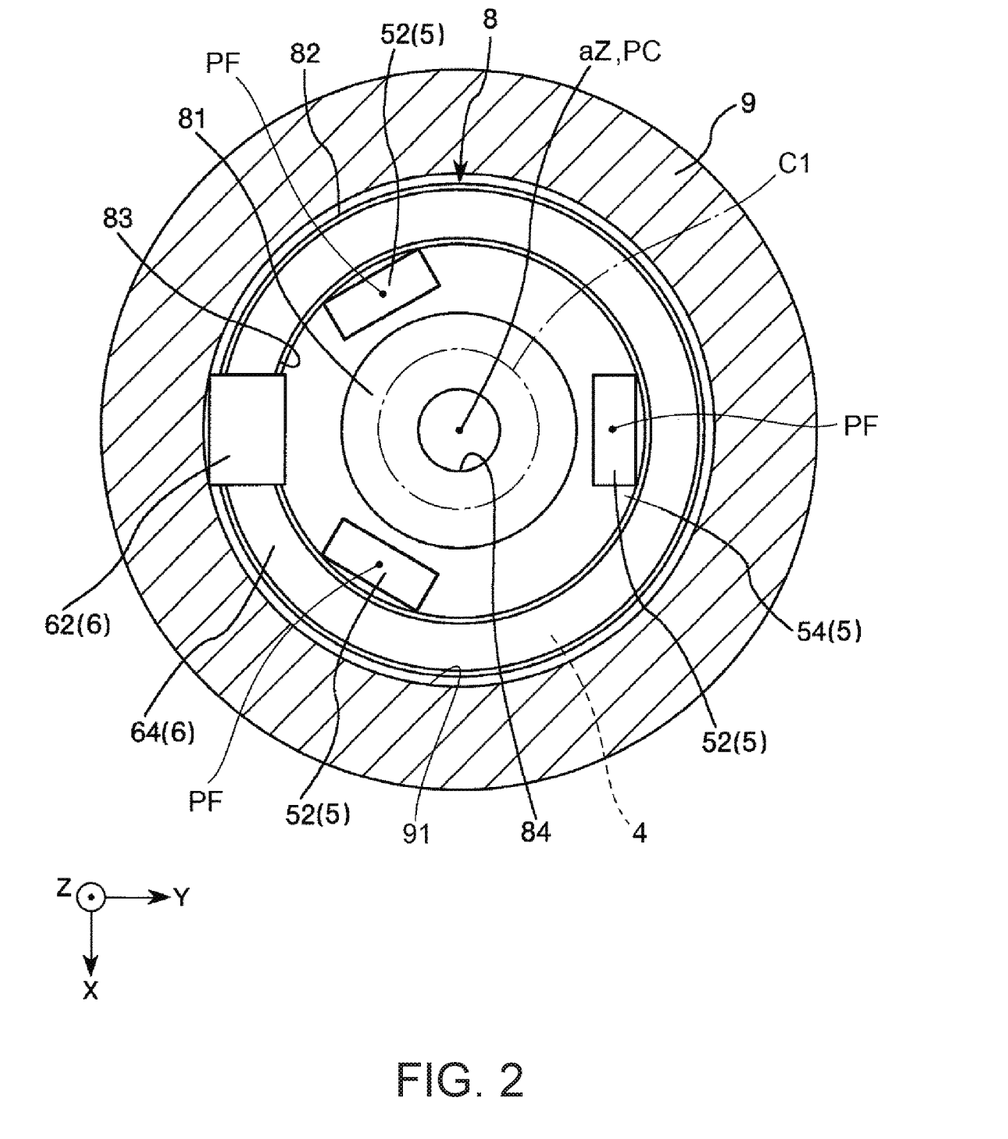
FIG. 2 shows the piezoelectric driving device shown in FIG. 1 as seen from a Z-axis direction.
Figure 3:
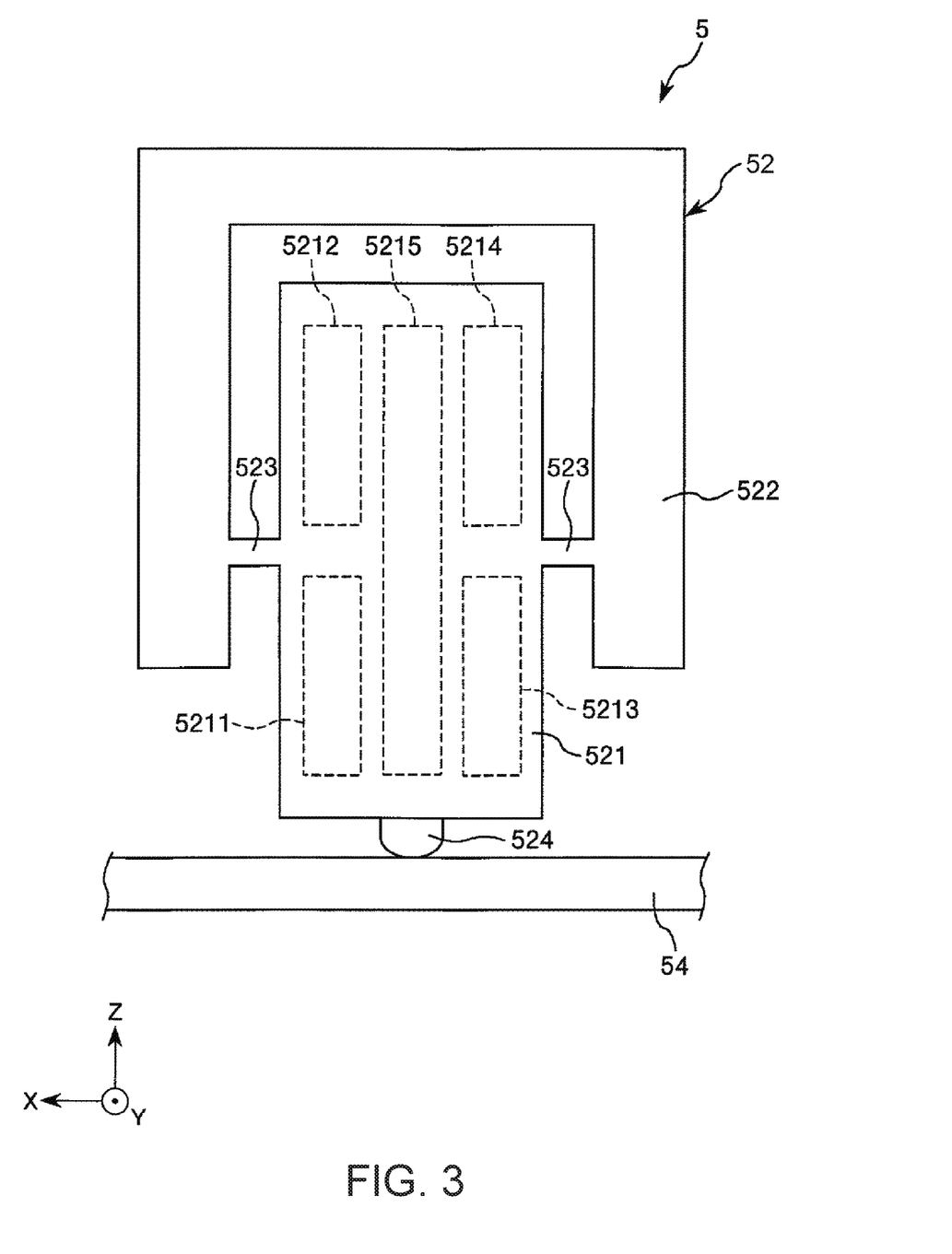
FIG. 3 is a plan view of a piezoelectric actuator of the piezoelectric driving device shown in FIG. 1.
Figure 4:
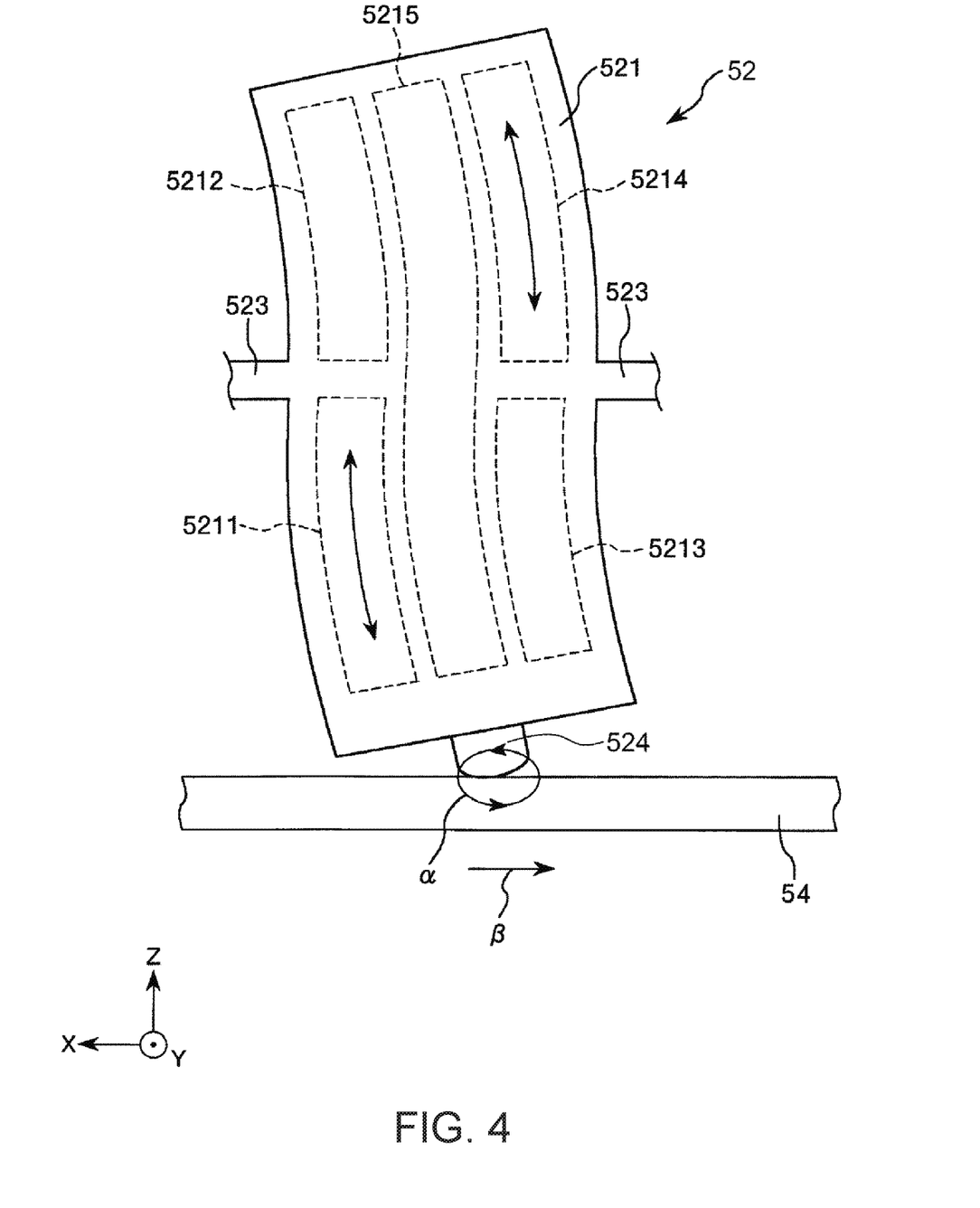
FIG. 4 is a diagram for explanation of an action of the piezoelectric actuator shown in FIG. 3.

FIG. 1 is a sectional view (longitudinal sectional view) showing a piezoelectric driving device according to an embodiment of the invention. FIG. 2 shows the piezoelectric driving device shown in FIG. 1 as seen from a Z-axis direction (cross sectional view). FIG. 3 is a plan view of a piezoelectric actuator of the piezoelectric driving device shown in FIG. 1. FIG. 4 is a diagram for explanation of an action of the piezoelectric actuator shown in FIG. 3.

Note that, hereinafter, for convenience of explanation, the explanation will be made using an X-axis, Y-axis, Z-axis as three axes orthogonal to one another as appropriate. Further, in the drawings to be described later, the tip end sides of the arrows showing these axes are referred to as "+" and the base end sides are referred to as "−". The directions parallel to the X-axis are referred to as "X-axis directions", the directions parallel to the Y-axis are referred to as "Y-axis directions", and the directions parallel to the Z-axis are referred to as "Z-axis directions". Furthermore, the side in the +Z-direction is also referred to as "upper" and the side in the −Z-direction is also referred to as "lower". The state as seen from the Z-axis direction is referred to as "plan view". In FIG. 2, for convenience of explanation, parts of a drive part 5, a detection part 6, and a second member 9 are not shown.

As shown in FIG. 1, a piezoelectric driving device 1 has a first member 8, the second member 9, a bearing 4 that rotatably supports the second member 9 about an axis line aZ (rotation axis) parallel to the Z-axis relative to the first member 8, the drive part 5 that rotates the second member 9 about the axis line aZ relative to the first member 8, the detection part 6 (encoder) that detects the relative rotation of the second member 9 about the axis line aZ to the first member 8, and a circuit part 7 that operates the drive part 5 and the detection part 6.

The first member 8 and the second member 9 are respectively formed using e.g. metal materials, ceramics materials, or the like. The outer shapes of the first member 8 and the second member 9 in the plan view are respectively circular shapes as shown in FIG. 2, however, these outer shapes are not limited to those.

Here, as shown in FIG. 1, a concave portion 83 is formed in one surface (upside in FIG. 1) of the first member 8. The bottom surface of the concave portion 83 forms a placement surface 81 on which a driven member 54 of the drive part 5, which will be described later, is placed. Further, a placement surface 82 on which an optical scale 64 of the detection part 6, which will be described later, is provided around the concave portion 83 on the one surface (upside in FIG. 1) of the first member 8.

In the first member 8, a hole 84 opening to the bottom surface of the concave portion 83 and penetrating in the thickness direction (Z-axis direction) of the first member 8 around the axis line aZ is formed. As shown in FIG. 2, the outer shapes of the concave portion 83 and the hole 84 are respectively circular shapes around the axis line aZ as seen from the Z-axis direction (hereinafter, also referred to as "plan view"). Accordingly, the placement surface 81 has an annular shape around the axis line aZ in the plan view. Also, the placement surface 82 has an annular shape around the axis line aZ in the plan view.

As shown in FIG. 1, a reduced diameter portion 851 having a smaller width (diameter) and an increased diameter portion 852 having a larger width (diameter) than the reduced diameter portion 851 on the side in the +Z-axis direction with respect to the reduced diameter portion 851 are provided in an outer circumferential surface 85 of the first member 8. Note that the outer shapes of the reduced diameter portion 851 and the increased diameter portion 852 in the plan view are respectively circular shapes in the drawing, however, not limited to those. For example, other polygonal shapes including quadrangular shapes and pentagonal shapes, elliptical shapes, or the like may be employed. Further, the hole 84 may be provided as appropriate or omitted.

As shown in FIG. 1, in the second member 9, a concave portion 91 opening to the first member 8 side, a concave portion 92 opening to the opposite side to the first member 8, and a hole 93 opening to both of the bottom surfaces of the concave portions 91, 92 and penetrating the second member 9 in the thickness direction (Z-axis direction) are formed. The concave portion 91 has a circular shape in the plan view and the above described first member 8 is inserted into the concave portion 91.

As shown in FIG. 1, the bearing 4 is placed between the above described first member 8 and second member 9. The bearing 4 has an inner ring 44, an outer ring 45, and a plurality of rolling members 46 provided between the rings.

The inner ring 44 is fitted and fixed into the outer circumferential surface 85 (reduced diameter portion 851) of the above described first member 8. The outer ring is fitted and fixed into the inner circumferential surface of the concave portion 91 of the above described second member 9. The rolling members 46 are members rolling between the inner ring 44 and the outer ring 45 in contact with the rings, e.g. rollers or balls. Further, the inner ring 44, the outer ring 45, and the rolling members 46 are adapted to restrict (limit) the relative movements of the first member 8 and the second member 9 in other directions than the rotation direction around the axis line aZ.

The drive part 5 has the driven member 54 placed on the first member 8, a plurality of (three in the drawing) piezoelectric actuators 52 that transmit driving forces to the driven member 54, and a plurality of (three in the drawing) supporting members 55 that support the plurality of piezoelectric actuators 52 with respect to the second member 9.

The driven member 54 is placed on the placement surface 81 of the above described first member 8 and fixed to the first member 8 by e.g. fitting, bonding using an adhesive, screwing, or the like. Further, the driven member 54 may be integrally formed with the first member 8. As shown in FIG. 2, the driven member 54 has an annular shape around the axis line aZ in the plan view. Here, the driven member 54 has a plate-like shape or sheet-like shape and is formed using a material having higher abrasion resistance such as a ceramics material. Note that the plan view shape of the driven member 54 is not limited to the illustrated shape (annular shape), but a part in the circumferential direction may be lost depending on the movable range of the piezoelectric driving device 1, for example.

Here, the plurality of piezoelectric actuators 52 are placed inside of the outer ring 45 of the bearing 4 in the plan view (as seen from the Z-axis direction). A center PC of load points PF of the plurality of (three) piezoelectric actuators 52 (hereinafter, also simply referred to as "the center PC of the piezoelectric actuators 52") is located inside (on the side of the axis line aZ) of the outer ring 45 of the bearing 4 (the outer circumferential part of the bearing 4) in the plan view. In the embodiment, the center PC of the piezoelectric actuators 52 coincides with the axis line aZ in the plan view. As described above, the center PC of the pressing forces from the plurality of piezoelectric actuators 52 to the driven member 54 (hereinafter, also simply referred to as "pressing forces") is located inside (on the side of the axis line aZ) of the outer circumferential part of the bearing 4 (particularly, an inner circumferential surface of the outer ring 45), and thereby, moment generated between the first member 8 side (inner ring 44) and the second member 9 side (outer ring 45) by the pressing forces may be reduced and, as a result, the relative attitude of the first member 8 and the second member 9 may be stabilized. Note that the center PC is preferably located inside of the inner ring 44 (the inner circumferential surface of the bearing 4) and more preferably located inside of a circle C1 having a radius on mid points between an inner circumferential surface 47 of the inner ring 44 the axis line aZ (see FIG. 2).

Here, "load point PF" refers to the center (geometric center) of the pressing force (load) acting on the driven member 54 (the first member 8 or a member fixed thereto) from each piezoelectric actuator 52, and specifically, refers to the center of the contact part between a projecting portion 524, which will be described later, and the driven member 54. The pressing force (load) acting on the driven member 54 from each piezoelectric actuator 52 is derived by elastic deformation of an elastic member (not shown), which will be described later. Further, "center PC" refers to the center of the plurality of load points PF and the center of the forces (loads) acting on the driven member 54 from the plurality of (three in the embodiment) piezoelectric actuators 52 (the center of all loads). In the embodiment, all of the respective load points PF are located inside of the outer ring 45 of the bearing 4. In addition, the respective load points PF are located at the equal distance from the axis line aZ and at equal angular intervals, and thus, the center PC coincides with the axis line aZ.

Note that it is only necessary that the center PC of the piezoelectric actuators 52 is located inside (on the side of the axis line aZ) of the outer ring 45 of the bearing (the outer circumferential part of the bearing 4) in the plan view, but the center does not necessarily coincide with the axis line aZ. Further, even when the plurality of piezoelectric actuators 52 are placed outside of the outer ring 45 of the bearing 4 in the plan view, the relative attitude of the first member 8 and the second member 9 may be stabilized. Here, the effect of stabilization of the relative attitude of the first member 8 and the second member 9 is greater in the case where the plurality of piezoelectric actuators 52 are placed inside of the outer ring 45 of the bearing 4 (particularly, the inner circumferential surface 48 of the outer ring 45) in the plan view than that in the case where the plurality of piezoelectric actuators 52 are placed outside of the outer ring 45 of the bearing 4 in the plan view. Furthermore, even when the plurality of piezoelectric actuators 52 are placed outside of the outer ring 45 of the bearing 4 in the plan view, the respective piezoelectric actuators 52 are placed to be pressed toward the axis line aZ side (particularly, the piezoelectric actuators are placed so that the line segments as extensions of the respective load points PF in the pressing directions of the piezoelectric actuators 52 may pass inside of the outer ring 45 of the bearing 4), and thereby, the effect of stabilization of the relative attitude of the first member 8 and the second member 9 may be improved to some degree.

As shown in FIG. 3, the piezoelectric actuator 52 has a vibrating portion 521, a supporting portion 522, a pair of connecting portions 523 connecting these portions, and the projecting portion 524 projecting from the vibrating portion 521. The piezoelectric actuator 52 shown in FIG. 3 is the piezoelectric actuator 52 located on the right side in FIG. 2 and generates the driving force in the X-axis direction. In the following description, the piezoelectric actuator 52 will be representatively explained, however, the other piezoelectric actuators 52 are the same except that the attitudes (the directions of the driving forces) within the XY-plane are different.

The vibrating portion 521 has a plate-like shape along the XZ-plane. Further, the vibrating portion 521 has a longitudinal shape extending along the Z-axis direction. The vibrating portion 521 has a piezoelectric element 5215 placed in the center part in the width direction (X-axis direction) of the vibrating portion 521 along the longitudinal direction of the vibrating portion 521, two piezoelectric elements 5211, 5212 placed on one side in the width direction of the vibrating portion 521 with respect to the piezoelectric element 5215 along the longitudinal direction of the vibrating portion 521, and two piezoelectric elements 5213, 5214 placed on the other side in the width direction of the vibrating portion 521 with respect to the piezoelectric element 5215 along the longitudinal direction of the vibrating portion 521.

The vibrating portion 521 has e.g. two substrates such as silicon substrates, a piezoelectric material such as lead titanate zirconate (PZT) placed between these substrates, and a plurality of electrodes provided on front and back sides of the piezoelectric material as appropriate (not shown). Here, each of the supporting portion 522 and the pair of connecting portions 523 has e.g. two substrates integrally formed with the two substrates of the above described vibrating portion 521. Further, in the supporting portion 522, e.g. an insulating spacer having an equal thickness to the piezoelectric material of the above described vibrating portion 521 is inserted between the two substrates.

The projecting portion 524 is provided to project on one end (tip end) (the downside in FIG. 3) in the longitudinal direction (Z-axis direction) of the vibrating portion 521 in the center part in the width direction. The projecting portion 524 is formed using e.g. a material having higher abrasion resistance such as ceramics, and joined to the vibrating portion 521 using an adhesive or the like. The projecting portion 524 has a function of transmitting vibration of the vibrating portion 521 to the driven member 54 by friction sliding and may be referred to as "transmitting portion". Note that the shape of the projecting portion 524 (transmitting portion) is not limited to the illustrated shape as long as the portion can transmit the driving force of the vibrating portion 521 to the driven member 54.

The plurality of supporting members 55 are provided in correspondence with the plurality of piezoelectric actuators 52 and the plurality of piezoelectric actuators 52 are placed at equal angular intervals on the same circumference around the axis line aZ. The respective supporting members 55 are formed using e.g. a metal material, ceramics material, or the like and respectively fixed to the supporting portions 522 and the second member 9 using e.g. screws or the like.

Here, the supporting portion 522 of the piezoelectric actuator 52 is supported by the supporting member 55 via an elastic member (e.g. a plate spring or the like) (not shown), and the supporting portion 522 is fixed with respect to the second member 9 via the elastic member and the supporting member 55 so that the projecting portion 524 may be brought into contact with (pressed against) the driven member 54 at predetermined pressure with the elastic deformation of the elastic member. As described above, the piezoelectric actuator 52 is supported by the second member 9 while being pressed against the first member 8 or the member fixed thereto (driven member 54). In the embodiment, the direction of the pressing force is the Z-axis direction. Note that the direction of the pressing force is not limited to the Z-axis direction, but preferably includes a component in the Z-axis direction (the Z-axis direction or a direction inclined with respect to the Z-axis direction) in view of facilitation of stabilization of the relative attitude of the first member 8 and the second member 9 with less influence of rattles of the bearing 4.

The above described piezoelectric actuator 52 of the drive part 5 operates by appropriate input of drive signals at predetermined frequencies to the piezoelectric elements 5211 to 5215 from the circuit part 7. For example, the phase difference between the drive signals to the piezoelectric elements 5211, 5214 and the drive signals to the piezoelectric elements 5212, 5213 is set to 180° and the phase difference between the drive signals to the piezoelectric elements 5211, 5214 and the drive signal to the piezoelectric element 5215 is set to 30°, and thereby, as shown in FIG. 4, the vibrating portion 521 flexurally vibrates into S-shapes by expansion and contraction of the respective piezoelectric elements 5211 to 5215 and the tip end of the projecting portion 524 makes elliptic motion in a direction shown by an arrow α in the drawing. As a result, the driven member 54 is subjected to the driving force in one direction (the direction shown by an arrow β in the drawing) from the projecting portion 524. The driving force is in the direction along the circumferential direction of the driven member 54, and thereby, relatively rotates the first member 8 and the second member 9 about the axis line aZ.

Or, when the first member 8 and the second member 9 are relatively rotated in the opposite direction to that in the case shown in FIG. 4, the drive signal may be applied to the piezoelectric element 5215 so that the phase difference from the drive signals to the piezoelectric elements 5211, 5214 may be 210°. Note that, in the illustrated configuration, the driven member 54 is placed on the first member 8 side and the piezoelectric actuator 52 is placed on the second member 9 side, however, reversely, the driven member 54 may be placed on the second member 9 side and the piezoelectric actuator 52 may be placed on the first member 8 side.

The detection part 6 has an optical scale 64 placed on the first member 8, a sensor 62 that detects movement of the optical scale 64, and a board 63 that supports the sensor 62 with respect to the second member 9.

The optical scale 64 is placed on the placement surface 82 of the above described first member 8 and fixed to the first member 8 using e.g. an adhesive or the like. The optical scale 64 is e.g. a slit plate, polarizer, or the like. Note that the optical scale 64 has an annular shape around the axis line aZ in the plan view. The plan view shape of the optical scale 64 is not limited to the illustrated shape (annular shape), but a part in the circumferential direction may be lost depending on the movable range of the piezoelectric driving device 1, for example.

The sensor 62 includes a light emitting device such as a semiconductor laser that irradiates the optical scale 64 with light and a light receiving device such as a photodiode that receives the reflected light from the optical scale 64 (not shown).

The board 63 is e.g. a wiring board and fixed to the second member 9 using screws or the like. The board 63 supports the sensor 62 and is respectively electrically connected to the sensor 62 and the circuit part 7.

In the above described detection part 6, the waveform of the output signal of the light receiving device of the sensor 62 changes according to the relative rotation condition (rotation position, angular velocity, or the like) of the second member 9 to the first member 8 about the axis line aZ. Therefore, the relative rotation condition of the second member 9 to the first member 8 about the axis line aZ may be detected based on the output signal of the light receiving device.

The circuit part 7 is placed within the concave portion 92 of the above described second member 9. The circuit part 7 has a circuit for operating the above described piezoelectric actuator 52 and sensor 62. For example, the circuit part 7 includes a drive circuit for driving the piezoelectric actuators 52 (generating drive signals), a drive circuit for driving the light emitting device of the sensor 62, an arithmetic circuit for calculating the relative rotation angle of the second member 9 to the first member 8 based on the signal from the light receiving device of the sensor 62, etc. Note that the circuits (drive circuit, arithmetic circuit) for the sensor of the circuit part 7 may be incorporated into the detection part 6 and, in this case, may be integrated with the sensor 62. Or, the circuit part 7 may be provided outside of the piezoelectric driving device 1.

As described above, the piezoelectric driving device 1 includes the first member 8, the second member 9, the bearing 4 that supports the second member 9 rotatably about the axis line aZ (rotation axis) relative to the first member 8, the driven member 54 placed on the first member 8, and the plurality of piezoelectric actuators 52 that transmit driving forces for rotating the second member 9 about the axis line aZ relative to the first member 8 to the driven member 54. Here, the piezoelectric actuators 52 are supported by the second member 9 while being pressed against the first member 8 or the member fixed thereto (driven member 54). As seen from the direction along the axis line aZ (rotation axis), the center PC of the pressing forces from the plurality of piezoelectric actuators 52 to the driven member 54 is located inside of the outer ring 45 (outer circumferential part) of the bearing 4.

According to the piezoelectric driving device 1, the plurality of piezoelectric actuators 52 are used and the larger driving forces may be obtained. In addition, as seen from the direction along the axis line aZ, the center PC of the pressing forces from the plurality of piezoelectric actuators 52 to the driven member 54 is located on the side of the axis line aZ (inside) of the outer ring 45 (outer circumferential part) of the bearing 4, and thereby, the moment generated between the first member 8 side and the second member 9 side of the bearing 4 by the pressing forces may be reduced and, as a result, the relative attitude of the first member 8 and the second member 9 may be stabilized.

Here, the bearing 4 has the inner ring 44 fixed to the first member 8, the outer ring 45 placed outside of the inner ring 44 and fixed to the second member 9, and the plurality of rolling members 46 placed between the inner ring 44 and the outer ring 45. As seen from the direction (Z-axis direction) along the axis line aZ (rotation axis), the center PC of the pressing forces is located inside of the outer ring 45 (particularly, the inner circumferential surface 48 of the outer ring 45). Thereby, loads in both the direction along the axis line aZ (thrust direction) and the radial direction orthogonal thereto may be applied to the bearing 4 with reduced rattles of the bearing 4.

Further, as described above, the respective piezoelectric actuators 52 are pressed against the driven member 54 in the Z-axis direction. Therefore, the direction of the pressing forces from the respective piezoelectric actuators 52 to the driven member 54 includes a direction component parallel to the axis line aZ (rotation axis). Thereby, the forces in the direction parallel to the axis line aZ (Z-axis direction) may be stably applied to the first member 8 side and the second member 9 side of the bearing 4. Accordingly, the rattles of the bearing 4 may be reduced and, as a result, the relative attitude of the first member 8 and the second member 9 may be stabilized more effectively.

In the embodiment, as seen from the direction (Z-axis direction) along the axis line aZ (rotation axis), the center PC of the pressing forces from the plurality of piezoelectric actuators 52 to the driven member 54 coincides with the axis line aZ (rotation axis). Or, without the coincidence, the center PC is preferably located in a position closer to the axis line aZ, e.g. inside of the circle C1 having the radius on the mid points between the inner circumferential surface 47 of the inner ring 44 (the center of the circle is the axis line aZ) and the axis line aZ. Thereby, the moment generated between the first member 8 side and the second member 9 side of the bearing 4 by the pressing forces may be reduced more effectively.

As seen from the direction (Z-axis direction) along the axis line aZ (rotation axis), the plurality of piezoelectric actuators 52 are located inside of the outer circumferential surface of the bearing 4 (particularly, the inner circumferential surface 48 of the outer ring 45). Thereby, the moment generated between the first member 8 side and the second member 9 side of the bearing 4 by the pressing forces may be reduced more effectively. Further, the piezoelectric driving device 1 may be downsized.

2. Electronic Component Conveyance Apparatus

Next, an embodiment of the electronic component conveyance apparatus according to the invention will be explained.

Figure 5:
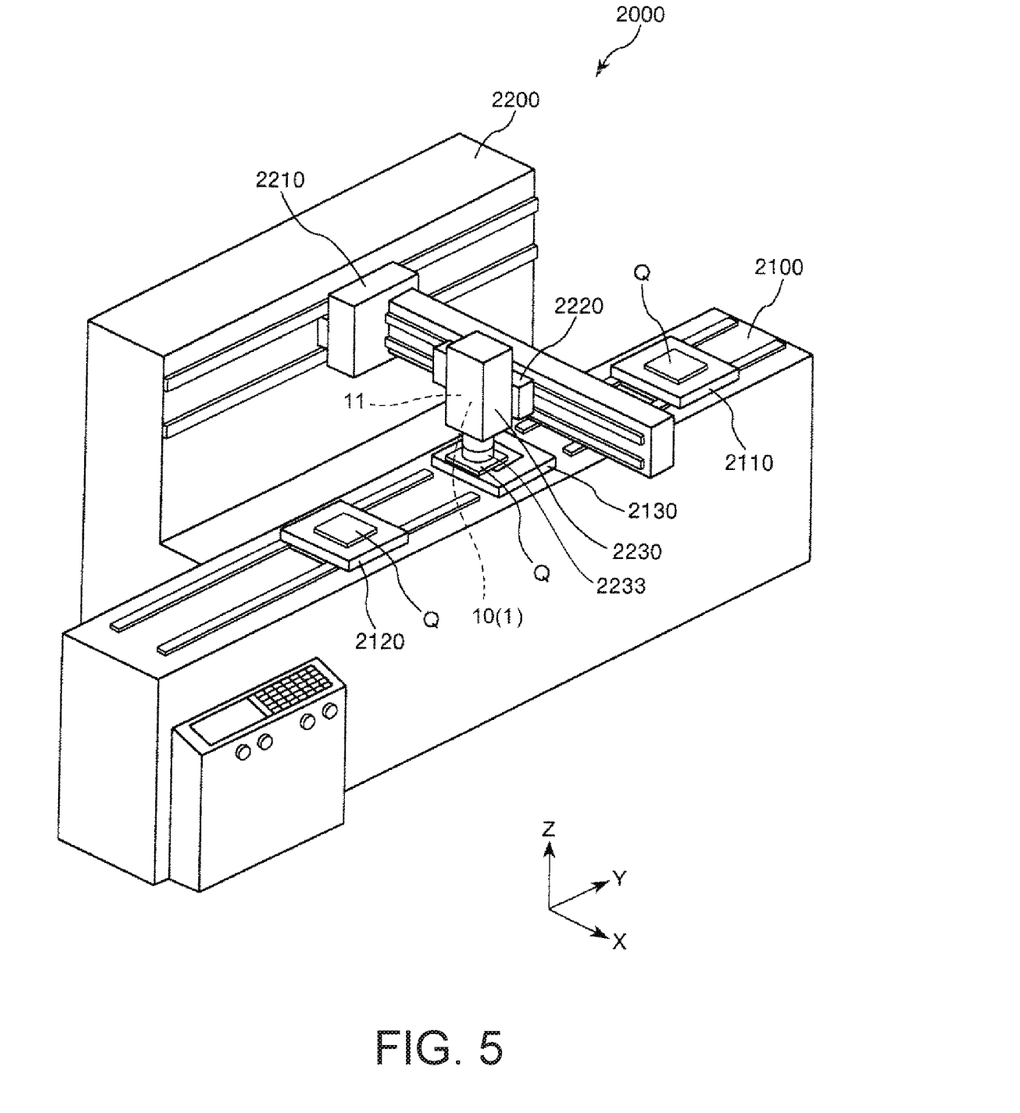
FIG. 5 is a perspective view showing an embodiment of an electronic component conveyance apparatus according to the invention.
Figure 6:
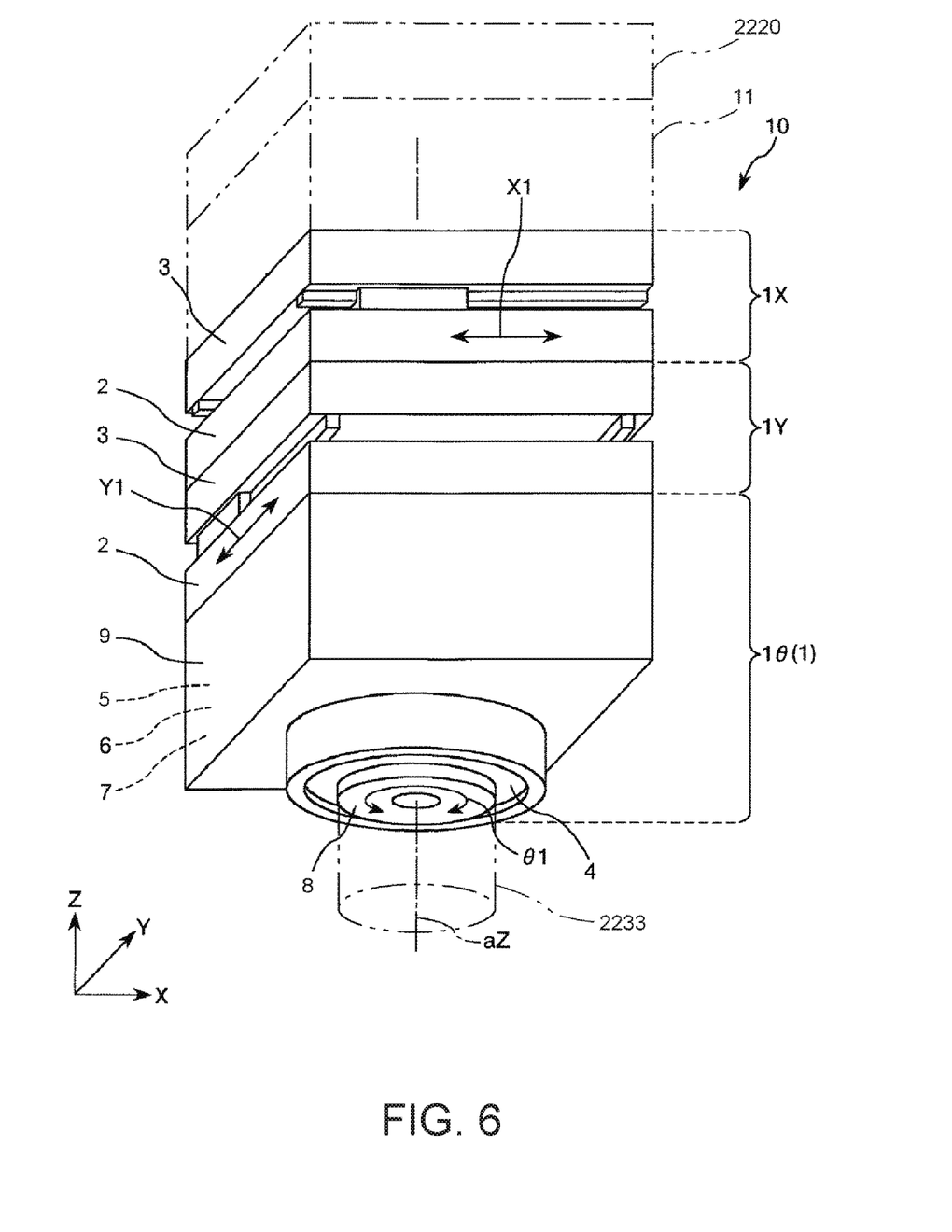
FIG. 6 is a perspective view showing a schematic configuration of a piezoelectric driving device of the electronic component conveyance apparatus shown in FIG. 5.

FIG. 5 is a perspective view showing the embodiment of the electronic component conveyance apparatus according to the invention. FIG. 6 is a perspective view showing a schematic configuration of a piezoelectric driving device of the electronic component conveyance apparatus shown in FIG. 5.

An electronic component conveyance apparatus 2000 shown in FIG. 5 is applied to an electronic component inspection apparatus, and has a base 2100 and a support 2200 provided on the side of the base 2100. Further, on the base 2100, an upstream stage 2110 on which an electronic component Q to be inspected is mounted and conveyed in the Y-axis directions, a downstream stage 2120 on which an electronic component Q that has been inspected is mounted and conveyed in the Y-axis directions, and an inspection table 2130 located between the upstream stage 2110 and the downstream stage 2120, on which electrical characteristics of an electronic component Q is inspected are provided. Note that examples of the electronic components Q include e.g. semiconductors, semiconductor wafers, display devices such as CLD and OLED, quartz crystal devices, various sensors, inkjet heads, various MEMS devices, etc.

Further, a Y-stage 2210 movable in the Y-axis directions with respect to the support 2200 is provided on the support 2200, an X-stage 2220 movable in the X-axis directions with respect to the Y-stage 2210 is provided on the Y-stage 2210, and an electronic component holding part 2230 movable in the Z-axis directions with respect to the X-stage 2220 is provided on the X-stage 2220.

The electronic component holding part 2230 has a piezoelectric driving device 10 as a positioning unit for fine positioning in the X-axis directions, in the Y-axis directions, and about the Z-axis, a holding part 2233 that holds the electronic component Q, and a pressing mechanism part 11 that can move the holding part 2233 in the Z-axis direction via the piezoelectric driving device 10. Here, the holding part 2233 is supported by the pressing mechanism part 11 via the piezoelectric driving device 10. The pressing mechanism part 11 is e.g. a pneumatic cylinder or hydraulic cylinder, supported by the X-stage 2220 (support), and adapted to move the piezoelectric driving device 10 in the Z-axis directions. Further, the pressing mechanism part 11 is adapted to press the holding part 2233 (electronic component Q) toward one (object) of the upstream stage 2110, the downstream stage 2120, and the inspection table 2130 via the piezoelectric driving device 10.

The piezoelectric driving device 10 shown in FIG. 6 is a piezoelectric driving unit that performs driving in the X-axis directions (directions shown by an arrow X1 in the drawing), in the Y-axis directions (directions shown by an arrow Y1 in the drawing), and about the Z-axis (directions shown by an arrow θ1 in the drawing). The piezoelectric driving device 10 has a piezoelectric driving device 1X (first piezoelectric driving device) that performs driving in the X-axis directions, a piezoelectric driving device 1Y (second piezoelectric driving device) that performs driving in the Y-axis directions, and a piezoelectric driving device 10 (third piezoelectric driving device) that performs driving about the Z-axis, and these are coupled side by side along the Z-axis direction.

Here, the piezoelectric driving devices 1X, 1Y have the same configuration as each other. More specifically, each of the piezoelectric driving devices 1X, 1Y has a first member 2 and a second member 3 that relatively moves in one direction (X-axis directions or Y-axis directions) to the first member 2 by a driving force from a drive part (not shown). Note that the attitude of the piezoelectric driving device 1Y within the XY-plane is different from the piezoelectric driving device 1X by 90°. Here, the second member 3 of the piezoelectric driving device 1X is fixed to the above described pressing mechanism part 11 using e.g. screws, bolts/nuts, or the like. Further, the second member 3 of the piezoelectric driving device 1Y is fixed to the first member 2 of the piezoelectric driving device 1X to take the above described attitude using e.g. screws, bolts/nuts, or the like.

The piezoelectric driving device 10 is the above described piezoelectric driving device 1. Here, the holding part 2233 is fixed to the first member 8 using e.g. screws, bolts/nuts, or the like. Further, the first member 2 of the above described piezoelectric driving device 1Y is fixed to the second member 9 using e.g. screws, bolts/nuts, or the like.

As described above, the electronic component conveyance apparatus 2000 includes the piezoelectric driving device 1. According to the electronic component conveyance apparatus 2000, the high-accuracy operation of the electronic component conveyance apparatus 2000 may be realized using such action and effect of the piezoelectric driving device 1 that the relative attitude of the first member 8 and the second member 9 may be stabilized.

3. Robot

Next, an embodiment of the robot according to the invention will be explained.

Figure 7:
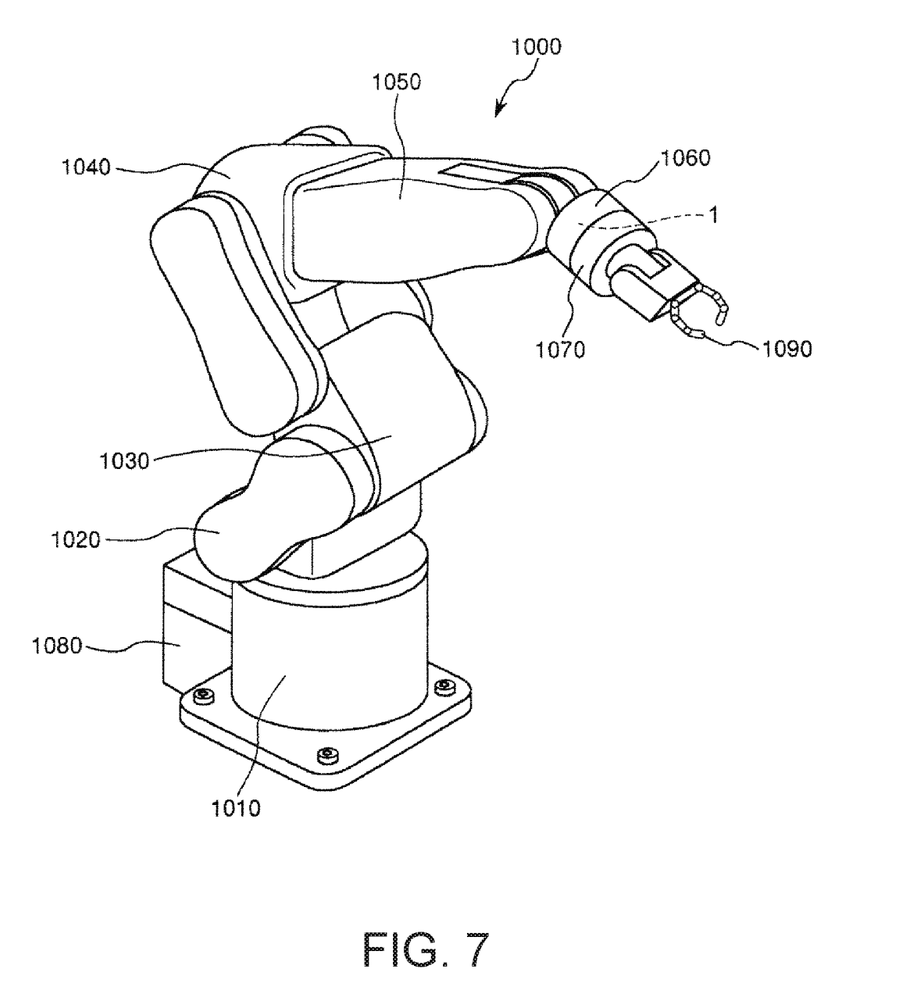
FIG. 7 is a perspective view showing an embodiment of a robot according to the invention.

FIG. 7 is a perspective view showing the embodiment of the robot according to the invention.

A robot 1000 shown in FIG. 7 may perform work of feeding, removing, carrying, assembly, etc. of precision apparatuses and components forming the apparatuses (objects). The robot 1000 is a six-axis robot, and has a base 1010 fixed to a floor or ceiling, an arm 1020 rotatably coupled to the base 1010, an arm 1030 rotatably coupled to the arm 1020, an arm 1040 rotatably coupled to the arm 1030, an arm 1050 rotatably coupled to the arm 1040, an arm 1060 rotatably coupled to the arm 1050, an arm 1070 rotatably coupled to the arm 1060, and a control unit 1080 that controls driving of these arms 1020, 1030, 1040, 1050, 1060, 1070. Here, in the arm 1060, the piezoelectric driving device 1 that functions as a motor that generates a driving force for rotating the arm 1070 with respect to the arm 1060 is provided. Further, in the arm 1070, a hand connecting part (not shown) is provided, and an end effector 1090 (member) according to work to be executed by the robot 1000 is attached to the hand connecting part. Driving of the piezoelectric driving device 1 is controlled by the control unit 1080. Note that the piezoelectric driving device 1 may be used for driving of the other arm than the arm 1070.

As described above, the robot 1000 includes the piezoelectric driving device 1. According to the robot 1000, the high-accuracy operation of the robot 1000 may be realized using such action and effect of the piezoelectric driving device 1 that the relative attitude of the first member 8 and the second member 9 may be stabilized.

4. Projector

Figure 8:
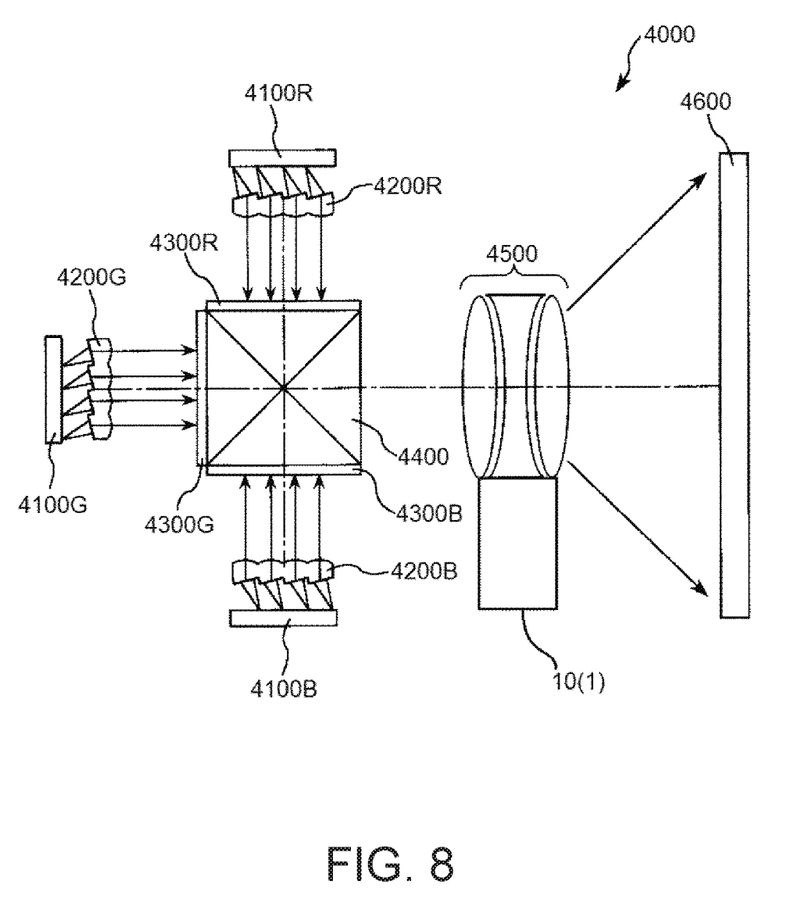
FIG. 8 is a schematic diagram showing an embodiment of a projector according to the invention.

FIG. 8 is a schematic diagram showing an embodiment of the projector according to the invention.

A projector 4000 shown in FIG. 8 has a red light source 4100R, a green light source 4100G, a blue light source 4100B that output red light, green light, and blue light, lens arrays 4200R, 4200G, 4200B, transmissive liquid crystal light valves (light modulation parts) 4300R, 4300G, 4300B, a cross dichroic prism 4400, a projection lens (projection part) 4500, and the piezoelectric driving device 10.

The lights output from the light sources 4100R, 4100G, 4100B enter the liquid crystal light valves 4300R, 4300G, 4300B via the respective lens arrays 4200R, 4200G, 4200B. The respective liquid crystal light valves 4300R, 4300G, 4300B modulate the respective entering lights according to image information.

The three color lights modulated by the respective liquid crystal light valves 4300R, 4300G, 4300B enter the cross dichroic prism 4400 and are combined. The light combined by the cross dichroic prism 4400 enters the projection lens 4500 as a projection system. The projection lens 4500 enlarges the images formed by the liquid crystal light valves 4300R, 4300G, 4300B and projects the images on a screen (display surface) 4600. Thereby, desired pictures are projected on the screen 4600. Here, the projection lens 4500 is supported by the piezoelectric driving device 10 so that changes of the position and attitude (positioning) can be made by driving of the piezoelectric driving device 10. Thereby, the shapes, sizes, etc. of the pictures projected on the screen 4600 may be adjusted.

Note that, in the above described example, the transmissive liquid crystal light valves are used as the light modulation parts, however, other light valves than those of liquid crystal may be used or reflective light valves may be used. The light valves include e.g. reflective liquid crystal light valves and digital micromirror devices. Further, the configuration of the projection system is changed as appropriate depending on the type of the light valves for use. The projector may be a scanning projector that displays images in desired sizes on the display surface by scanning with light on the screen.

As described above, the projector 4000 includes the piezoelectric driving device 1. According to the projector 4000, the high-accuracy operation of the projector 4000 may be realized using such action and effect of the piezoelectric driving device 1 that the relative attitude of the first member 8 and the second member 9 may be stabilized.

5. Printer

Figure 9:
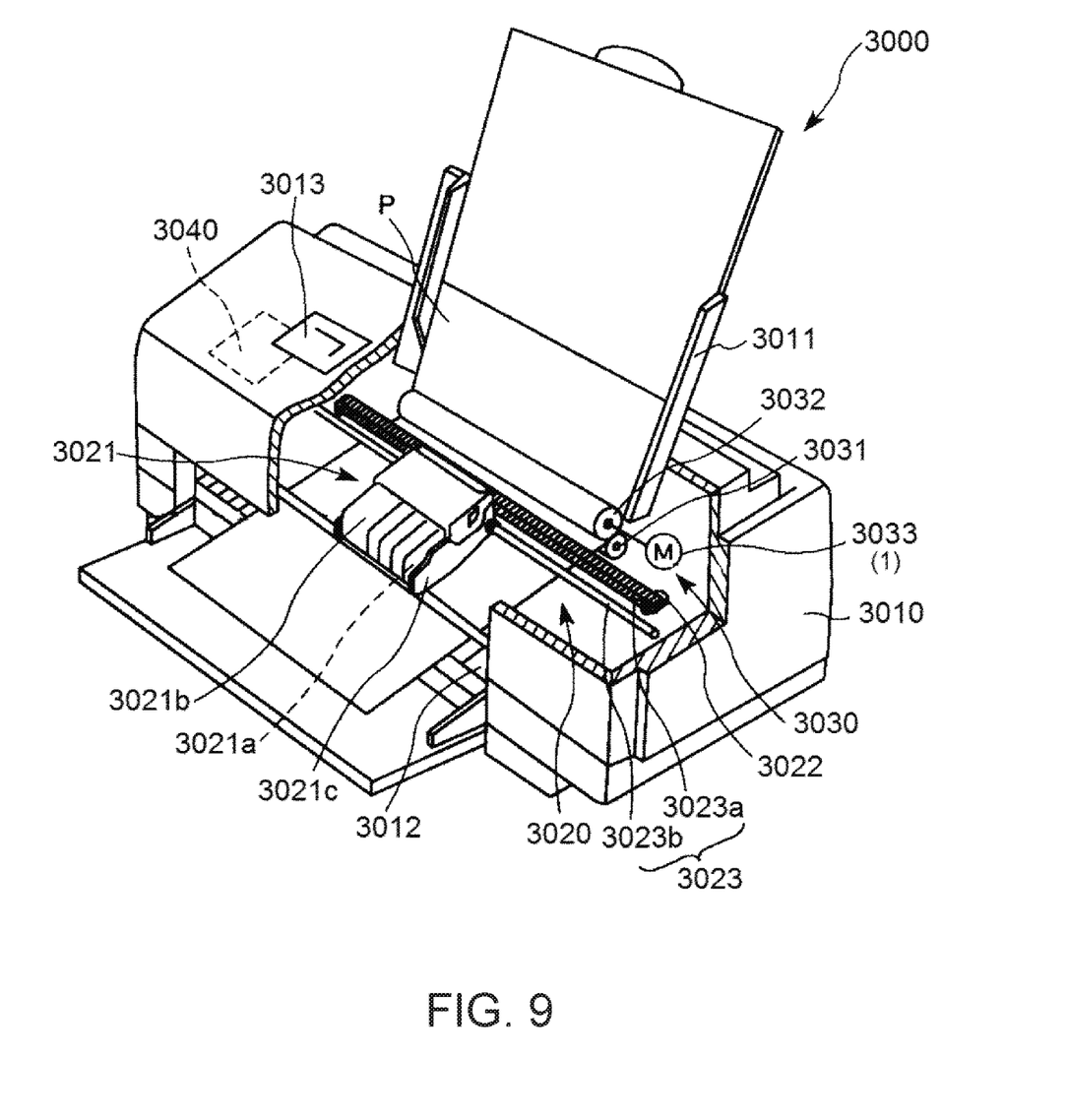
FIG. 9 is a perspective view showing an embodiment of a printer according to the invention.

FIG. 9 is a perspective view showing an embodiment of the printer according to the invention.

A printer 3000 shown in FIG. 9 is a printer of an inkjet recording type. The printer 3000 includes an apparatus main body 3010, a printing mechanism 3020 provided inside of the apparatus main body 3010, a paper feed mechanism 3030, and a control unit 3040.

In the apparatus main body 3010, a tray 3011 in which recording paper P is placed, a paper eject opening 3012 through which the recording paper P is ejected, and an operation panel 3013 including a liquid crystal display are provided.

The printing mechanism 3020 includes a head unit 3021, a carriage motor 3022, and a reciprocation mechanism 3023 that reciprocates the head unit 3021 by a driving force of the carriage motor 3022. The head unit 3021 has a head 3021*a* as an inkjet recording head, an ink cartridge 3021*b* that supplies ink to the head 3021*a*, and a carriage 3021*c* on which the head 3021*a* and the ink cartridge 3021*b* are mounted. The reciprocation mechanism 3023 has a carriage guide shaft 3023*a* that reciprocably supports the carriage 3021*c* and a timing belt 3023*b* that moves the carriage 3021*c* on the carriage guide shaft 3023*a* by the driving force of the carriage motor 3022.

The paper feed mechanism 3030 has a driven roller 3031 and a driving roller 3032 in press contact with each other, and a paper feed motor 3033 that drives the driving roller 3032. Here, the paper feed motor 3033 is the piezoelectric driving device 1.

The control unit 3040 controls the printing mechanism 3020, the paper feed mechanism 3030, etc. based on printing data input from a host computer such as a personal computer, for example.

In the printer 3000, the paper feed mechanism 3030 intermittently feeds the recording paper P one by one to the vicinity of the lower part of the head unit 3021. Concurrently, the head unit 3021 reciprocates in directions nearly orthogonal to the feed direction of the recording paper P, and printing on the recording paper P is performed.

As described above, the printer 3000 includes the piezoelectric driving device 1. According to the printer 3000, the high-accuracy operation of the printer 3000 may be realized using such action and effect of the piezoelectric driving device 1 that the relative attitude of the first member 8 and the second member 9 may be stabilized.

As above, the piezoelectric driving device, electronic component conveyance apparatus, robot, projector, and printer according to the invention are explained based on the illustrated embodiments, however, the invention is not limited to those. The configurations of the respective parts may be replaced by arbitrary configurations having the same functions. Further, other arbitrary configurations may be added to the invention.

The entire disclosure of Japanese Patent Application No. 2017-092203, filed May 8, 2017 is expressly incorporated by reference herein.

What is claimed is:

1. A piezoelectric driving device comprising:
   a first member;
   a second member;
   a bearing that rotatably supports the second member about a rotation axis relative to the first member;
   a driven member placed on the first member; and
   a plurality of piezoelectric actuators that transmit driving forces for rotating the second member about the rotation axis relative to the first member to the driven member,
   wherein the plurality of piezoelectric actuators are supported by the second member while being pressed against the first member or a member fixed thereto, and
   as seen from a direction along the rotation axis, a center of pressing forces from the plurality of piezoelectric actuators to the driven member is located inside of an outer circumferential part of the bearing.

2. The piezoelectric driving device according to claim 1, wherein a direction of the pressing force includes a direction component parallel to the rotation axis.

3. An electronic component conveyance apparatus comprising the piezoelectric driving device according to claim 2.

4. A robot comprising the piezoelectric driving device according to claim 2.

5. A projector comprising the piezoelectric driving device according to claim 2.

6. A printer comprising the piezoelectric driving device according to claim 2.

7. The piezoelectric driving device according to claim 1, wherein, as seen from the direction along the rotation axis, the center of the pressing forces coincides with the rotation axis.

8. An electronic component conveyance apparatus comprising the piezoelectric driving device according to claim 7.

9. A robot comprising the piezoelectric driving device according to claim 7.

10. A projector comprising the piezoelectric driving device according to claim 7.

11. A printer comprising the piezoelectric driving device according to claim 7.

12. The piezoelectric driving device according to claim 1, wherein, as seen from the direction along the rotation axis, the plurality of piezoelectric actuators are located inside of the outer circumferential part of the bearing.

13. An electronic component conveyance apparatus comprising the piezoelectric driving device according to claim 12.

14. A robot comprising the piezoelectric driving device according to claim 12.

15. A projector comprising the piezoelectric driving device according to claim 12.

16. The piezoelectric driving device according to claim 1, wherein the bearing has:
   an inner ring fixed to the first member;
   an outer ring placed outside of the inner ring and fixed to the second member; and
   a plurality of rolling members placed between the inner ring and the outer ring, and
   as seen from the direction along the rotation axis, the center of the pressing forces is located inside of the outer ring.

17. An electronic component conveyance apparatus comprising the piezoelectric driving device according to claim 1.

18. A robot comprising the piezoelectric driving device according to claim 1.

19. A projector comprising the piezoelectric driving device according to claim 1.

20. A printer comprising the piezoelectric driving device according to claim 1.

* * * * *